United States Patent [19]

Owechko

[11] Patent Number: 4,837,843
[45] Date of Patent: Jun. 6, 1989

[54] HYBRID OPTICAL AND ELECTRONIC ASSOCIATIVE MEMORY

[75] Inventor: Yuri Owechko, Newbury Park, Calif.
[73] Assignee: Hughes Aircraft Company, Los Angeles, Calif.
[21] Appl. No.: 64,901
[22] Filed: Jun. 19, 1987
[51] Int. Cl.⁴ .............................................. G06K 9/76
[52] U.S. Cl. .................................... 382/31; 350/3.75; 350/3.85; 365/125; 382/42
[58] Field of Search .................... 365/125; 382/31, 42; 350/162.11, 162.12, 162.13, 162.14, 162.15, 3.75, 3.67, 3.81, 3.82, 3.85

[56] References Cited

U.S. PATENT DOCUMENTS

| | | | |
|---|---|---|---|
| 4,084,153 | 4/1978 | Otten | 365/125 |
| 4,115,801 | 9/1978 | Salmen et al. | 382/42 |
| 4,155,630 | 5/1979 | Ih | 350/3.67 |
| 4,462,046 | 7/1984 | Spight | 382/42 |
| 4,490,849 | 12/1984 | Grumet et al. | 382/31 |
| 4,546,248 | 10/1985 | Craig | 350/354 |
| 4,556,986 | 12/1985 | Craig | 382/42 |
| 4,637,055 | 1/1987 | Taylor | 382/31 |
| 4,637,056 | 1/1987 | Sherman et al. | 382/31 |

FOREIGN PATENT DOCUMENTS

WO87/02505  4/1987  PCT Int'l Appl.

OTHER PUBLICATIONS

Almeida et al., "A Real-Time Hybrid Optical System for Pattern Recognition", *IEEE Trans. on Instrumentation and Measurement*, vol. IM-26, No. 4, 12/1977.

Abu-Mostafa et al., "Optical Neural Computers", *Scientific American*, vol. 256, No. 3, Mar. 1987, pp. 88-95.

W. P. Bleha et al., "Application of the Liquid Crystal Light Valve to Real-Time Optical Data Processing", *Optical Engineering*, vol. 17, No. 4, Jul. 1978, pp. 371-384.

D. Psaltis et al., "Shift Invariance in Optical Associative Memories", SPIE, vol. 625, Optical Computing, 1986, pp. 189-195.

Glenn D. Craig, "Wide-Brightness-Range Video Camera", NASA Tech Briefs, Fall 1985, Electronic Systems. (one page).

G. J. Dunning et al., "Optical Holographic Associative Memory Using a Phase Conjugate Resonator", SPIE, vol. 625, Optical Computing, Jan. 1986, pp. 205-213.

(List continued on next page.)

Primary Examiner—Leo H. Boudreau
Assistant Examiner—Joseph Mancuso
Attorney, Agent, or Firm—V. D. Duraiswamy; A. W. Karambelas

[57] ABSTRACT

An associative memory system is provided which is a hybrid of optical and electronic components. In the preferred embodiment, a Fourier transform hologram is used to convolve a reference beam with correlated input images and stored object images. An electronic iteration loop is provided which is used to derive an enhanced reference beam for use in matching and enhancing the associative memory of the hologram with the object input plane image. The iteration loop of electronic components comprises a vidicon which receives the correlation plane image and provides that image in the form of an electronic signal to an electronic thresholding device or image processor. The image processor is capable of viewing the data at the rate of 30 frames per second and is used in the preferred embodiment to threshold the data with reference to the greatest amplitude portion of the correlation spot provided to the vidicon. After the electronic threshold has processed the signal, an improved signal is provided to the cathode ray tube screen. This processed signal is used to phase-modulate a projection light readout beam through use of a liquid crystal light valve. A polarizing beam splitter converts the phase modulation of the readout beam to an amplitude modulation wherein an enhanced reference beam is derived which is processed back to the hologram for readout at the output plane of the system. In this manner a variable-gain fast response electronic and optical component hybrid is provided for use as an associative memory.

13 Claims, 5 Drawing Sheets

OTHER PUBLICATIONS

B. H. Soffer et al., "Associative Holographic Memory with Feedback Using Phase-Conjugate Mirrors", Optics Letters, vol. 11, Feb. 1986 pp. 118–120.

J. J. Hopfield, "Neural Networks and Physical Systems with Emergent Collective Computational Abilities," Proc. Nat'l. Academy of Science, U.S.A., vol. 79, 1982, pp. 2554–2558.

U. Efron et al., "Silicon Liquid Crystal Light Valves: Status and Issues", Optical Engineering, Nov./Dec. 1983, vol. 22, No. 6, pp. 682–686.

Gerlach et al., "Single-Spatial Light Modulator Bistable Optical Matrix Device Using Optical Feedback", Optical Engineering, vol. 19, No. 4, Jul./Aug. 1980, pp. 452–455.

E. G. Paek et al., "Optical Associative Memory Using Fourier Transform Holograms", Optical Engineering, May 1987, vol. 26, No. 5, pp. 428–433.

Fig. 4.a 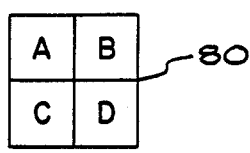 Fig. 4.b 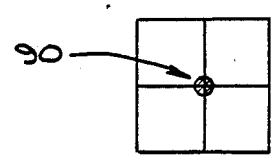
Fig. 5.a 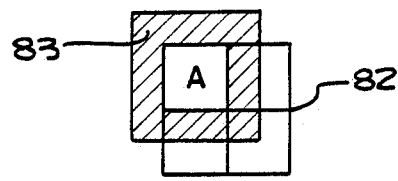 Fig. 5.b 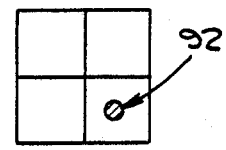
Fig. 6.a 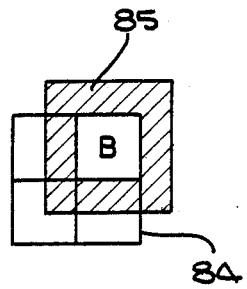 Fig. 6.b 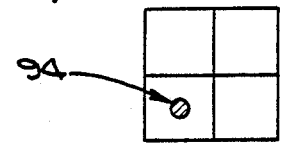
Fig. 7.a 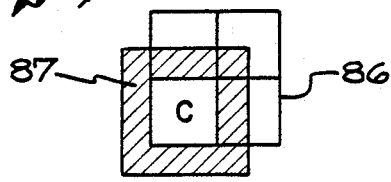 Fig. 7.b 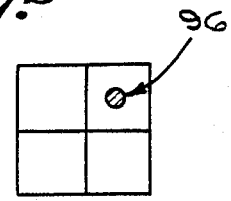
Fig. 8.a 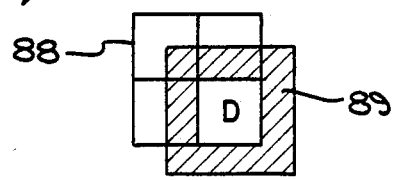 Fig. 8.b 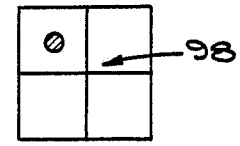

HYBRID OPTICAL AND ELECTRONIC ASSOCIATIVE MEMORY

This Invention was made with Government Support under Contract No. F49620-84-C-0096 awarded by Department of Air Force. The U.S. Government has certain rights in the Invention.

FIELD OF THE INVENTION

This Invention relates to Associative Memory Systems and in particular to Associative Memory Systems using electronic and optical components.

BACKGROUND OF THE INVENTION

The speed and computational accuracy of modern digital computers are well-known. However, all digital computers solve problems in a sequential fashion through the use of numerical computation. While the processing unit contained in a simple pocket calculator can easily out-perform the human brain in number crunching tasks, digital computers are able to accomplish this sophisticated numerical analysis only on a step-by-step basis. Digital computers exhibit their best abilities when presented with a serially programmable algorithm.

Digital computers are not capable of sophisticated parallel processing, such as that required when a human undertakes the task of pattern recognition. Problems such as comparing the fingerprint found at the scene of a crime with a data base full of fingerprints is the sort of practical and necessary problem that arises and yet is not easily solved by a digital computer. To the extent that digital computers have been programmed to match the fingerprint found at the scene of the crime with an existing fingerprint in the files, lengthy serial searches of memory are required to digitally achieve accurate pattern recognition.

A matrix algebra based on an associative memory model was described by J. J. Hopfield in his paper "Neural Networks and Physical Systems with Emergent Collective Computational Abilities," proceedings of the National Academy of Science U.S.A., 1982, Vol. 79, pp. 2554–2558. The Hopfield model utilizes feedback and nonlinear thresholding to force the output pattern to be the stored pattern which most closely matches an input pattern presented to the associative memory system. A digital emulation of this model requires large storage and computational effort for the manipulation of an association matrix used in the model. For example, in order to store two-dimensional image patterns consisting of $N \times N$ pixels, the model requires a matrix with $N^4$ entries be used.

A natural implementation of an associative memory model would be one which uses optical technology. Optical associative memory systems store information as patterns; so that, upon the introduction of a stored pattern to the system, the system is able to recall the stored pattern and perform a match. These Optical systems achieve massive parallel processing. The ability of an optical associative memory to perform such a function has wide application in the fields of pattern recognition and image understanding. Used in conjunction with a laser beam, specially treated photosensitive film or plates act as holograms. A hologram is a frozen "picture" of an object wherein the image of the object is recorded on the film plate as an interference pattern between a reference beam of plane waves (which is directed only at the photographic film) and an object wavefront (which is created by reflection from the object, where the object wavefront is made by the same coherent source that produced the reference beam). Holograms are characterized as having extremely good spatial coherence. The light used to produce the hologram, normally a laser beam, exhibits a high degree of temporal coherence. In order to view the recorded holographic image, one redirects coherent light along the same path as the reference beam which originally recorded the hologram. A viewer views the hologram along the same line of sight that connected the object and the hologram during its recording. Directing a new reference beam on the hologram causes an image to appear which, in a lensless environment, gives rise to a three-dimensional image. The lifelike dimensionality of a lensless image produced in a hologram is due to the fact that, unlike a photograph, a hologram stores not only amplitude changes but also records phase changes as interference fringes resulting from the interaction between spatially coherent object and reference beams.

Holograms are characterized by very precise and lifelike imaging. In addition, a hologram, when viewed from different angles, produces different views of the recorded image. The hologram is programmable for use in storing a plurality of images, by varying the angle of the reference beam used to record the image. The information stored within a hologram is recorded throughout the holographic medium; even a portion of the hologram retains the complete record. It therefore can be seen that holograms are quite useful in parallel processing systems. Furthermore, holograms are inherently useful for optical pattern recognition mechanisms.

Among the types of holograms known in the art are the volume, Fresnel, and Fraunhofer holograms. The volume holograms have a thickness and can be used to record either amplitude or phase modulated images without the generation of both primary and conjugate waves that is inherent with thin holograms. Fraunhofer holograms are characterized as holograms that record distant objects. Larger and closer positioned objects produce Fresnel holograms.

The Fourier transform hologram uses a lens and is adaptable for memory storage purposes. As is well known in the numerical analysis arts, the Fourier transform is a mathematical tool wherein any function may be broken up into a sum of sinusoidal superimposed patterns. This manner of dividing a function into its Fourier components is known as defining the Fourier transform of a function. In Fourier transform holography, one captures an object's wave front holographically, after it has undergone a Fourier transformation. To do this, one places a photographic holographic plate at the back focal plane of the lens. A flat object, such as a transparency, is placed at the same distance in front of the lens as the photographic plate is behind it. The object's wave front, when it reaches the plate, has been Fourier-transformed by the lens. The holographic pattern produced as an image is quite unlike the original object. If the object is illuminated only by coherent light, such as a laser beam, and if a reference beam is provided at an angle to the plate, the Fourier transform can be recorded as a hologram.

Pattern recognition has used Fourier transform holograms in another fashion to perform the operation of convolution. The best way to understand convolution is to look at an example. If one were to convolve a first transparency having three dots with a second transparency having one triangle, using a holographic Fourier transform, one obtains three triangles, one at each position of the dots. A related operation mathematically similar to convolution is correlation. The result of correlating two identical objects is a sharp peak at a position corresponding to the shift value which superimposes the two objects. The peak is greatly reduced if the two objects are not identical, making correlation useful in pattern recognition.

To correlate two transparencies (also referred to as objects) one simply positions a first object one focal length in front of a lens and a Fourier transform hologram of a second object one focal length back of this lens. A second lens is positioned in back of the Fourier transform hologram of the second object. The correlation of the first and second objects appears one focal length behind the second lens.

An example of optical pattern recognition using correlation would be where in a printed page of text, one could recognize a particular word or letter at some position on a page. Wherever the particular word appears in the text, a bright spot of light highlights the word in the correlated image. Wherever the word occurs on the page, there will be a corresponding bright spot of light in the correlated image called a correlation peak. Thus, the nature of holograms and lenses combined in an optical system using a coherent light source allows the operation of pattern recognition to occur. Such a device has been characterized as an optical neural computer. The term "neural" is derived from the fact that the parallel processing of a hologram to provide an associative memory is similar to that of a human brain's neural system in that the stored information is not localized.

Heretofore, one such optical associative memory has been proposed by Abu-Mostafa and Psaltis in *Scientific American*, vol. 256, no. 3 in an article entitled "Optical Neural Computers," at page 88 (March, 1987). In that article an optical thresholding device and a pinhole array were used as part of a double hologram associative memory system.

The applicant has previously disclosed (as a coinventor) in a pending patent application an associative memory system entitled "ASSOCIATIVE HOLOGRAPHIC MEMORY APPARATUS EMPLOYING PHASE CONJUGATE MIRRORS", Ser. No. 06/786,884, filed Oct. 11, 1985. Also, the applicant is a coinventor in a now pending application "ASSOCIATIVE HOLOGRAPHIC MEMORY APPARATUS EMPLOYING PHASE CONJUGATE MIRRORS IN A TWO-WAVE MIXING CONTRA-DIRECTIONAL COHERENT IMAGE AMPLIFIER", Ser. No. 06/821,237, filed Jan. 22, 1986. (The disclosures contained in both applications are hereby incorporated by reference.) Hughes Aircraft company, the assignee of this application, is also the assignee of these two pending applications. These systems also employ primarily all-optical elements.

As indicated above, optical elements, such as the hologram, make excellent associative memory storage devices. When a distorted input image is presented to a system which includes at least one hologram (containing a clear representation of that image), the system processes light through its components in such a manner as to correlate and match the distorted input image with one of the images stored on the hologram. The sharper the correlation peaks, the better the match. All optical systems are excellent parallel processors but generally may not be shift-invariant and furthermore, they may exhibit optical and gain losses in the system as the image is processed. In order to achieve a good match, an optical associative memory must have good thresholding and gain so that the correlation peak which reconstructs the reference beam (when the image is to be reconstructed) is sharp and bright. Losses of light intensity in the system are inevitable as the light is processed through an optical system as disclosed in the above-incorporated applications or as that disclosed in the Abu-Mostafa article, supra. Additionally, reconstruction and phase conjugation of the reference beam in the all-optical systems described in the pending patent application Ser. Nos. 06/786,884 and 06/821,237, is achieved inherently by use of phase conjugate mirrors, (PCMs) using for example $BaTiO_3$ material. In such systems, thresholding is determined by physical processes in the PCMs and is not easily alterable nor readily adjustable. Also, such optical systems heretofore have required at least a second for the PCM to respond. $BaTiO_3$—based optical techniques are relatively slow, in a computer sense. Phase conjugate mirrors of an all-optical component system may be used to fully reconstruct and return an image to its point of origin to achieve pattern recognition. Nonlinearities in the phase conjugate mirrors are used to select those stored objects which exceed a threshold, based on the overlap of computed integrals of the object input with the stored objects. Although, experimentally, store-and-recall of two objects with shift invariance, was achieved, the gains achieved by phase conjugate mirrors were not enough to overcome hologram losses. Additionally, the nonlinearities of the phase conjugate mirrors were difficult to control.

Therefore, an all-optical system using PCMs has certain advantages over an electronic computer in performing massive parallel operations, such as pattern recognition; however, such a system is relatively slow and the thresholding is not easily controlled.

It is therefore an object of this invention to provide a system which makes use of the pattern recognition properties of a hologram but in such a manner that optical losses are kept to a minimum, thresholding achieved, and sharp correlation of images at the hologram accomplished, with shift invariance and at video frame rates.

U.S. Pat. Nos. 4,546,248 and 4,556,986, both issued to Glenn D. Craig and assigned to the United States (NASA), disclose electro-optical systems used to process images with incoherent light sources. The systems represent attempts to vary spatially the optical gain of signals without thresholding or enhancement of optical images. Such references show the state of electro-optical art, but do not in themselves advance the achievement of the objects of this invention to provide a fast reaction shift invariant associative memory system.

SUMMARY OF THE INVENTION

A hybrid optical and electronic associative memory system capable of recalling a complete and undistorted stored image when the memory system is provided with an input image which is distorted (or is a part of the complete stored image or both) is disclosed. Such an input image is hereinbelow referred to as a "distorted image." The associative memory system of this invention includes a holographic means for recording and reconstructing a first object transform of a first object. Image transforming apparatus, such as a lens, provides a second transform of a second object to the hologram. The hologram forms the product of the transforms of the first object, second object, and the first reference beam used in recording the hologram. This composite product, known as a distorted second reference beam, is transformed by a correlation lens into a correlation function which is the transform of the product. The correlation function is enhanced by an electro-optic thresholding and light amplification system which also retroreflects the enhanced correlation back to the hologram as the enhanced second reference beam. The enhanced second reference beam then reads out the first object transform stored in the hologram. An image then appears in the output plane as a reconstructed first object after passing through the transform lens.

The electro-optical thresholding and light amplification subsystem of this invention includes a vidicon camera for receiving the reference beam from a correlation lens. This first vidicon camera has a standard response time of 30 frames per second; it can therefore be used to compare a holographic memory image with an input object of short duration. The vidicon camera provides an electronic output signal to an optical processor which (in the preferred embodiment) is an electronic image processor.

The processor refines and thresholds the signal to enhance the correlation peaks found at the correlation plane of the vidicon, thereby improving the quality of the reference beam and the resolution of the image. This first electronic image processor provides a processor output signal to a viewing or CRT screen. The CRT generates an electro-optical image signal at its output screen. The output screen of the CRT is juxtaposed against and aligned with a spatial light modulator, which in one presently preferred embodiment comprises an adjustable liquid crystal light valve (LCLV). The liquid crystal light valve (LCLV) is electronically controllable and modulates a high-intensity readout beam. A polarizing beam splitter amplitude-modulates the high-intensity readout beam according to the phase modulation control of the LC light valve. In this manner, the CRT, LCLV and polarizing beam splitter act as control elements of an optical "amplifier" The CRT, LCLV, and polarizing beam splitter amplify and enhance the reference beam and retroreflect the enhanced reference beam to the hologram. In an alternative embodiment, an imaging lens and a diffuser are positioned between the polarizing beam splitter and the hologram to provide better distribution of the light on the hologram.

It will be noted that electronics are introduced into the system only at the point where the parallel processing has already occurred or an enhanced image is needed to make the parallel processing mechanism of the hologram work more effectively. No attempt is made to use the electronics in place of an optical component where an optical component would better perform the function which is required. Electronic components are deliberately introduced to provide adjustable thresholding of the light beam initially presented to the correlation plane of the first vidicon camera, and to improve system performance by eliminating the PCMs.

A second leg of the system may be provided where-in a second vidicon camera receives a focused image from the hologram. This second vidicon camera provides an electronic signal to a second optical processor, which in the preferred embodiment is an electronic image processor. The second optical processor provides an object leg output signal to a second CRT. An image of the first object is displayed on the second CRT screen which may be threshold limited by the second image processor. The second CRT is operatively linked to a second LCLV and this second LCLV provides a modulated control of a second readout beam using a polarizing beam splitter. When the beam splitter is illuminated by the bright readout beam, an enhanced, and amplified object beam resonates within the memory system, providing a truer match on the holographic plate.

It can be seen that the present inventive system uses the flexibility of electronic control to perform functions which are more advantageously performed using electronics than using optical elements.

The processing of data, for pattern recognition purposes, accomplished by the associative memory of the present inventive electro-optical system may be generalized as an associative memory system where a first body of data is transformed and is recorded within a memory storage means, such as a hologram, using transforms (plane waves) of a reference set of data (delta functions) and the memory system is presented with a second incomplete body of data that is the distorted input image. For example, the nature of the transformation may be a Fourier transform. A second transform set of data corresponding to the second body of data is provided to the hologram. The hologram, in conjunction with a correlation device, generates the correlations of the first and second bodies of data. Such a generalized model also includes a means for enhancing and improving this correlation function to eliminate losses in the system and to achieve threshold. This improved correlation function is transformed as an enhanced reference beam which is then presented to the data storage area where the data stored in the system is kept. This results in the reconstruction of the first body of data.

An electronic data processor for resolving (by thresholding and amplifying) the correlation function is used to direct a composite product set of data back to the transformed data storage means. An associative processing occurs wherein the transformed data storage combines and correlates these first stored and transformed set of data with the second transformed input data and the reference data to form the composite product set of data, whereby a first stored body of data is associated with a second incomplete body of data. In applicant's presently preferred embodiment, the parallel processing and pattern recognition are accomplished optically, while thresholding and gain are accomplished electronically. However, the operation of the system may lend itself to use in a fully digital setting, where proper algorithms are programmed to drive the computer.

In any event, the hybrid optical and electronic associative memory system of this invention, which is capable of recalling a first stored image when the memory system is provided with a distorted input image, includes the hologram having an optical medium which records a first stored image of an object as a scattered field pattern transform which is frozen into the hologram. A light source produces an illuminated but possibly distorted input image for comparison with the stored image on the hologram. The stored image is reconstructed when the distorted image is presented to the hologram and the distorted image is correlated with both the first stored image and then combined (through convolution) with an enhanced reference (such as a delta function) which enables the first stored image of the object to be reconstructed through the hologram for viewing at the output plane.

The first electro-optical means includes a correlation means and a light amplification and thresholding means. The light amplification and thresholding subsystem are electronic and result in enhancing the reference beam so that the output of the inventive system is the stored image which best matches the input image.

BRIEF DESCRIPTION OF THE DRAWINGS

FIGS. 4(a) and 4(b) show the appearance of the input and correlation planes during simultaneous recording four different objects.

FIG. 5(a) shows the input image of the object A which is used to match the object A of the recorded image of 4(a).

FIG. 5(b) shows the positioning of the correlation spot on the correlation plane of the vidicon of FIG. 1 of this invention corresponding to the input image of FIG. 5(a).

FIG. 6(a) shows a masked input of an image of object B. FIG. 6(b) shows the positioning of the corresponding correlation spot.

FIG. 7(a) shows an image input selection of the object C.

FIG. 7(b) shows the corresponding positioning of the correlation spot on the correlation plane to the image C of FIG. 7(a).

FIG. 8(a) shows a masked selected object D of the four objects recorded in FIG. 4(a).

FIG. 8(b) shows the relative positioning of the correlation spot corresponding to the object D in the correlation plane of the first vidicon camera of FIG. 1.

DETAILED DESCRIPTION OF THE PREFERRED EMBODIMENT

Figure 1:
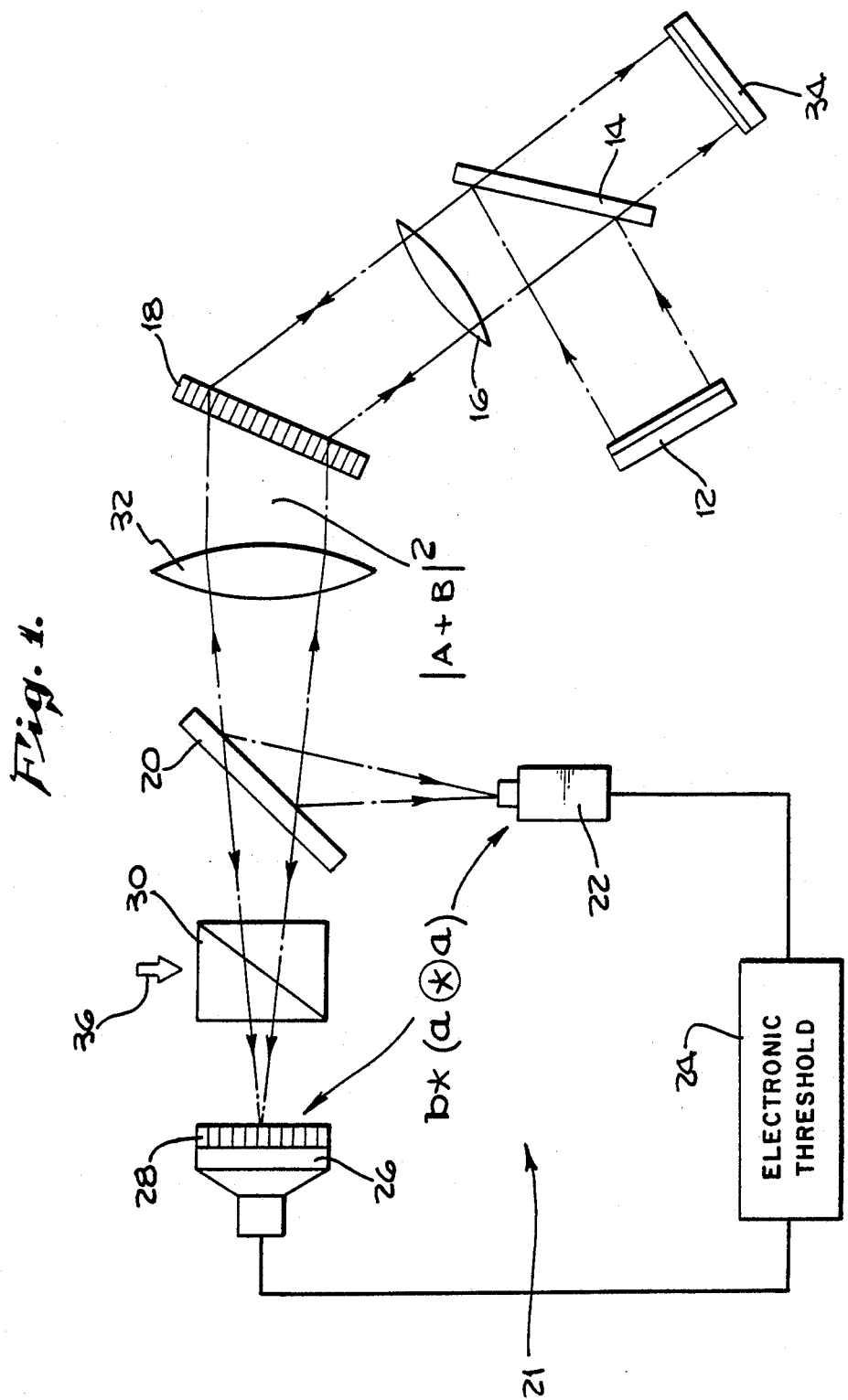
FIG. 1 shows a simplified first embodiment of the hybrid optical and electronic associative memory of this invention.
Figure 2:
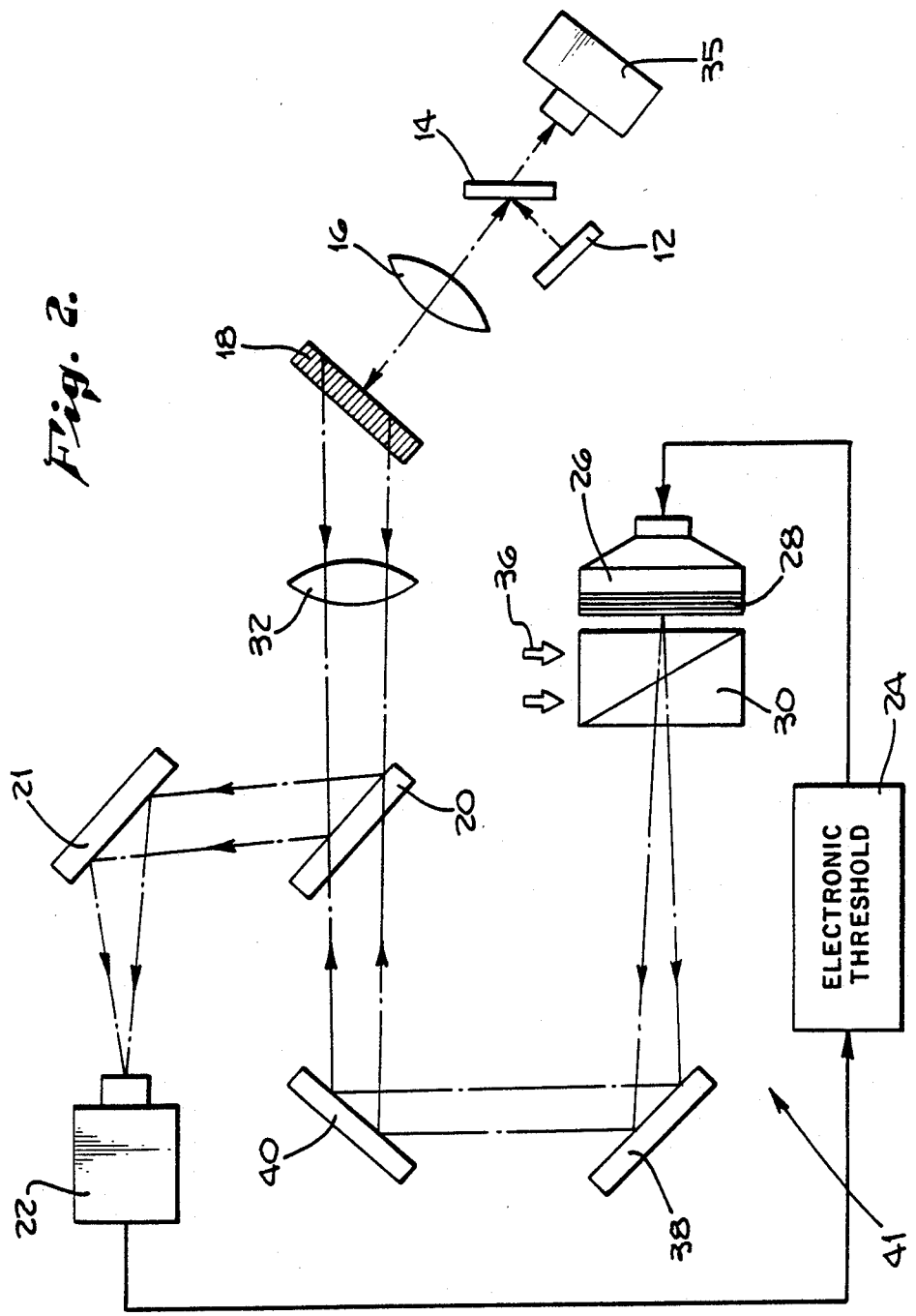
FIG. 2 shows the configuration of FIG. 1 in greater detail.

With reference to FIGS. 1 and 2, the preferred embodiments of the invention of this application are generally shown and may operate in a first recording mode and a second reconstruction mode. This description details the associative memory system operating in the reconstruction mode. A hologram 18 has stored within it at least two coherent wave amplitudes generated by at least two different objects. The hologram 18 carries within its light-sensitive medium both phase and amplitude information with regard to the objects stored therein. The particular hologram 18 which is described in detail in the following description is a Fourier transform hologram. However a Fresnel or a volume hologram can also be used. Utilizing a Fresnel or a volume hologram will, however, result in the loss of shift invariance, which is an important advantage of the Fourier transform hologram. By "shift invariance", it is meant that an object will be recognized and reconstructed regardless of its position in the input plane.

When the hologram 18 is irradiated by a complex wavefront which is a distorted version of the stored image, the hologram 18 may be used in conjunction with the other components of the system, to match the incomplete input image with the stored image on the hologram 18.

The distorted image is provided to the associative memory system by the object input plane 12. Light from the object input plane 12 is directed at the beam splitter 14. The beam splitter 14 redirects light from the object input plane 12 to the Fourier transform lens 16. It will be noted that the object input plane 12 is one focal length distance in front of the Fourier transform lens 16. The hologram 18 is one focal length in back of the Fourier transform lens 16. A composite product beam which is a distorted reference beam generated by the object wavefront incident on the hologram is provided through the correlation lens 32. The correlation lens 32 is in back of the hologram 18.

The distorted reference beam is provided to the beam splitter 20. This distorted reference light beam is then simultaneously provided to the correlation plane of the vidicon 22 and the liquid crystal light valve 28, each of which is one focal length in back of the correlation lens 32. The image received by the vidicon 22 and the light crystal light valve 28 may be characterized as the correlation of the stored image of the object, stored within the hologram 18, and the distorted input image from the object input plane 12.

In simplified mathematical terms, let a = an object "a";

A = a Fourier transform of the object "a" stored within the hologram 18;

b = a reference "b", the Fourier transform of which, B, is also stored in the hologram The quantities A and B are in general complex. Then, the amplitude transmittance of the hologram 18 is proportional to the magnitude squared of the sum of A and B or $|A+B|^2$.

If now a distorted input image $a'$ is provided by way of the Fourier transform lens 16 to the hologram 18, a transformed input image $A'$ is presented to the hologram 18. A Fourier transform hologram 18, when arranged in a system as shown in FIG. 1, gives rise to the correlation of the distorted image $a'$ with the quantity a which is in turn convolved with b.

It is well known that the convolution of two functions in the spatial domain equals the product of the Fourier transforms of each function in the spatial frequency domain. If the symbol "*" is used herein to indicate convolution, then, $b * (a' \circledast a)$ means b convolved with the quantity consisting of the correlation ($\circledast$) of $a'$ with a.

In the spatial frequency domain, the amplitude transmitted by the developed hologram is proportional to the expression $A' |A+B|^2$. If one were to expand this product, one would derive the following expression:

$$A' (A^2 + AB + B^2 + B\underline{A}).$$

Rearranging these terms, one would obtain the following expression:

$$A' (A^2 + B^2) + A' (BA) + A' (A\underline{B}),$$

where $\underline{A}$ is the complex conjugate of A and $\underline{B}$ is the complex conjugate of B.

The first two terms of this expression, are respectively, the zero order term and the −1 order term, neither of which are of direct concern to this invention; however, the last term, $A' (A\underline{B})$ is one which is important to this invention. B is a tilted plane wave, and this plane wave is derived from a reference b, which is a shifted delta function. Therefore, in the spatial domain, the quantity b*(a'⊛a) represents a shifted version of the correlation of the distorted input image a' with the stored a. FIG. 1 shows that the above quantity is present simultaneously at the vidicon (correlation plane) 22 and the liquid crystal light valve (LCLV) 28.

The above mathematical results are in keeping with what is experimentally observed in optical systems. If a first object is placed one focal length in front of a Fourier transform lens and a Fourier transform hologram of a second object is placed in back of the same Fourier transform lens by one focal length; then, a second lens is positioned one focal length behind the Fourier transform hologram of the second object, a screen which is one additional focal length behind the second lens will produce a correlated and convolved image of the first object and the second object which is stored in the Fourier transform hologram. If the stored image transform B is the Fourier transform of a delta function b, (i.e. a tilted plane wave), then the remaining terms of interest A' (A) in the frequency domain correspond to the spatial domain correlation of input image a' with the stored image a. These relationships of association arise intrinsically when a Fourier transform hologram 18 is used within an associative memory as shown in FIG. 1. The correlated images, as stated hereinbefore, are provided by the beam splitter 20 to the correlation plane of the vidicon 22 and the liquid crystal light valve 28.

One of the significant aspects of the invention and system disclosed in this application is the manner in which the correlated image provided to the vidicon 22 and the liquid crystal light valve 28 is enhanced by the iteration loop 21.

The image presented to the vidicon camera 22 by the correlation lens 32 and the beam splitter 20 has partially distorted spurious light associated with this correlated image due to the imperfect input of real time image from the object input plane 12 (a'). In order to remove distortions and provide a threshold value of amplitude intensity of the optical signal to the system, the distorted correlation image captured by the vidicon 22 is electronically provided to the electronic threshold unit 24. In the preferred embodiment, the electronic threshold device 24 may be an image processor which has rapid frame-grabbing capabilities. One such image processing device is the Series 100 TM computer adaptable circuit component board for IBM PC/ATs made by Imaging Technology Incorporated of Woburn, Mass. 01801. Thirty times a second, a new frame sweep of the screen of the vidicon 22 is made by the electronic threshold 24 and the information provided to the vidicon camera 22 is stored and translated digitally with the electronic threshold 24. As used in this application the term "threshold" refers to the electronic threshold 24 which adjusts its preprogrammed memory in such a manner so as to use the light intensity at the center of the correlation image presented to the vidicon 22 as a reference standard for determining what portion of the vidicon signal is eliminated and what other portion is further processed and sent to the CRT (cathode ray tube) screen 26. In other words, if the image on the vidicon 22 is partially distorted, such as that of a circle having flares or wings, these flares or wings at the outer portions of the correlation are clipped, so that the electronic threshold 24 provides to the CRT screen 26 a smooth, round correlation image.

This correlation image is then presented as writing light to a spatial light modulator, which is a liquid crystal light valve 28 in the preferred embodiment. The liquid crystal light valve is an optical-to-optical image transducer tat is capable of accepting a low-intensity input light image and converting it, in real time, to an output image with light from another source. The device is designed so that the input and output light beams are completely separated and noninteracting. The liquid crystal light valve (LCLV) 28 operates to modulate the phase of the readout beam 36 according to the control provided by the writing light of the CRT screen 26. The liquid crystal light valve provides optical birefringence wherein the birefringent phase of the readout beam 36 is spatially modulated by the light from the CRT. The polarizing beam splitter 30 directs the high intensity coherent readout beam 36 to the LCLV 28 and converts the birefringent phase modulation into amplitude modulation.

The polarizing beam splitter provides half its signal back to the hologram 18 along the bidirectional diverging path to the hologram 18 shown in FIG. 1 Thus, the original correlated image [a'⊛a] provided to the vidicon 22 is processed by the e threshold device 24 and provided to the CRT screen 26. This threshold-enhanced signal is boosted by operation of the liquid crystal light valve 28 (LCLV) which provides a higher gain strong signal to the hologram 18. This signal processing assures sharper and clearer correlation of the image from the object input plane 12 with a stored image a of the hologram 18, for viewing at the output plane 34.

With particular reference to FIG. 2, there is presented a detailed preferred system showing a liquid crystal light valve (LCLV) based associative memory of this invention. The input object 12 provides a partially distorted image by way of the beam splitter 14 to the Fourier transform lens 16 and onto the Fourier transform hologram 18. A vidicon 35 receives the output image much as the output image was viewed at the output plane 34 of FIG. 1. The correlation lens 32 is placed in back of the hologram 18 and provides a correlated image to both the vidicon 22 and the liquid crystal light valve 28 simultaneously.

The correlation lens 32 provides a correlation image to the vidicon 22 by means of the beam splitter 20 and the mirror 21. The liquid crystal light valve 28 receives its image from the correlation lens 32 through the beam splitter 20, mirror 40, mirror 38, and onto the liquid crystal light valve 28. The vidicon 22 perceives a partially distorted correlation plane image which is processed by the electronic threshold 24 which, as in FIG. 1, may be an image processor in the preferred embodiment. This electronic threshold 24 passes light from the correlation plane of the vidicon in the form of an electronic signal and displays an image of the light received on the screen of the CRT 26. Only that light which falls on the vidicon 22 of an intensity as great or higher than the center of the image falling on the vidicon 22, is provided to the CRT screen 26. The liquid crystal light valve (LCLV) 28 phase-modulates the readout beam 36 in accordance with the modulation control signal provided in the form of light at the surface of the CRT screen 26. The polarizing beam splitter 30 acts as described in FIG. 1 as both an analyzer to amplitude-modulate the readout beam 36 and to provide an amplified coherent light signal back to the hologram 18 by means of mirrors 38, 40, and beam splitter 20. In this manner a highly coherent and well-correlated pattern recognition system is demonstrated.

It will be noted that the optical "amplifier" effect achieved in the preferred embodiment uses (in FIG. 1) a CRT 26, driven by the electronic signal from the electronic threshold (image processor) 24, to phase-modulate the readout beam 36. Alternatively, phase-modulation of the readout beam 36 could be achieved by use of a spatial light modulator (SLM) 28 which is directly driven by this electronic signal from the threshold 24, eliminating the need for a CRT-controlled LCLV. (One such SLM would be the CCD-LCLV, disclosed in *Proceedings of SPIE* [Society of Photo-Optical Instrumentation Engineers] Vol. 308, at page 75, et seq. in an Article entitled "*Silicon Liquid Crystal Light Valves: Status and Issues*", by U. Effron, et al., Jan. 20-21, 1983.) SLMs have been developed which are directly electronically controllable and which amplitude-modulate a readout beam like 36. Such a device would allow one to remove the *polarizing* beam splitter 30 and replace it with an ordinary beam splitter.

Additionally, if a transmissive-type, electronically controllable SLM, which amplitude-modulates the readout beam 36, were used, the polarizing beam splitter 30 could be removed and not even require replacement. Thus, many variations of existing SLMs may be used in the system disclosed herein to modulate the readout beam 36, and some of these variations of the SLM would allow a reduction in the number and type of elements essential to the functioning of the iteration loop 21.

Figure 9:
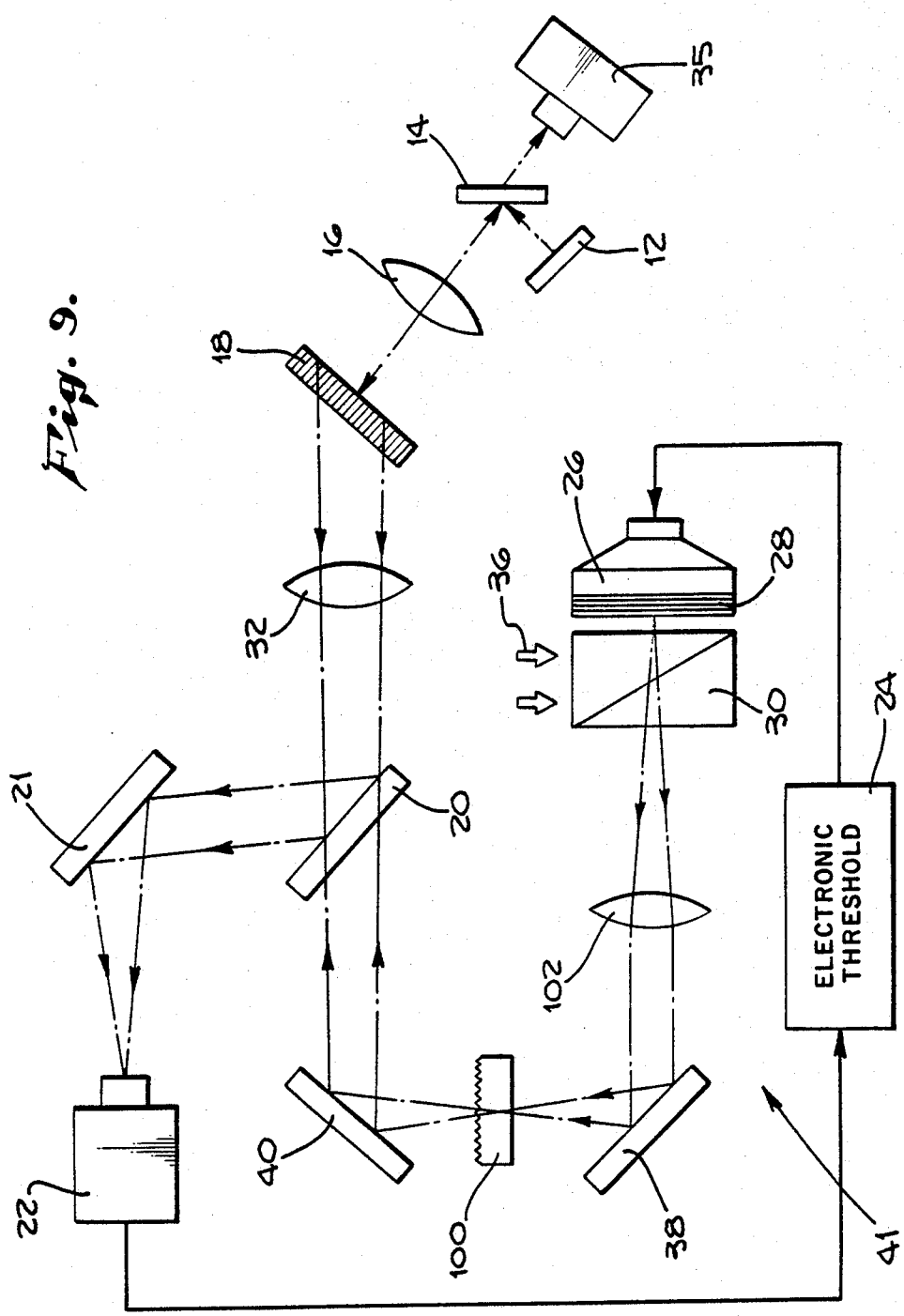
FIG. 9 shows an alternative configuration of the embodiment of the associative memory system shown in FIG. 1.

FIG. 9 shows an alternate embodiment to the LCLV-based associative memory system of FIG. 2 which has the additional elements of the diffuser 100 and the imaging lens 102. The Fourier transform hologram 18 stores the greater spatial frequency signals at its outer periphery, away from its center. It has been determined that when the correlation image, as enhanced, is brought back from the polarizing beam splitter 30 to the hologram 18 by way of the mirrors 38 and 40 and the beam splitter 20, the correlation lens 32 acting alone is not able to diffuse and spread the enhanced reference beam provided over the entire surface of the hologram 18. In order to assure this spreading of signal, an imaging lens 102 directs the enhanced signal that is returning from the liquid crystal light valve 28 to the hologram 18 through a diffuser 100. The diffuser 100 converts low spatial frequency input signals to high spatial frequency output signals. The high spatial frequency signals are then provided to the hologram 18. The additional elements of the imaging lens 102 and diffuser 100 provide even greater resolution to the electronic and optical associative memory system of this Invention.

As an additional illustration to understand the shift-invariant operation of this invention, it will be noted that FIG. 4(a) shows the input and output planes of the hologram 80 wherein objects A, B, C and D are recorded. A corresponding imaging occurs at the correlation plane of the vidicon 22 as image 90 (see FIG. 4(b)).

When a readout is made for example, of the object "A", a mask 83 is provided around the input object so that the area 82, will be masked by the mask 83. The readout image derived, as shown in FIG. 5(a), reveals an exact match between the object "A" stored in the hologram 80 and the distorted input image of object "A". It will be noted that the position of the image 92 in the correlation plane of FIG. 5(b) reveals a shift of the correlation image in response to the input image "A" which corresponds to a stored image.

Likewise, FIG. 6(a) shows an input image "B" contained within a plurality of images (A, B, C, D) on transparency 84 which is masked by border 85 so that at the output, one may be viewing an image "B" which is matched with a stored image "B" on the hologram 80. Again, there is correlation plane image shifting as a result of selecting the image "B" of FIG. 6(a). (See FIG. 6(b), the correlation plane showing the shift of the correlation image 94.)

FIG. 7(a) shows that when the object "C" is selected from plane 86, the readout matches the input, and the object "C" is viewed within the boundaries of the mask 87. FIG. 7(b) illustrates that the correlation image 96 is shifted in yet another direction on the correlation plane when the image "C" of FIG. 7(a) is selected.

Finally, a selection of the object "D", surrounded by mask 89, where the readout plane 88 reveals the object "D" matched to an input image (within the confines and boundaries defined by the mask 89), the correlation image 98 shifts in the correlation plane as shown in FIG. 8(b).

Thus, it is shown that each of the images, "A" through "D", of FIGS. 5(a) through 8(a), which were recorded in the hologram 80, show a unique shifting of the correlation plane image to render the pattern recognition achieved by the associative memory of this system relatively shift-invariant. By "shift-invariant" it is meant that shifting the input object in position does not affect the quality of the reconstruction, only its position. Each object image "A" through "D", has an associated reference beam of unique angular orientation that is needed to reveal the proper image from memory when the reference beam is used to recall the stored image. The above description is equivalent to recording multiple objects by utilizing a different reference beam angle for each object during recording of the hologram.

Figure 3:
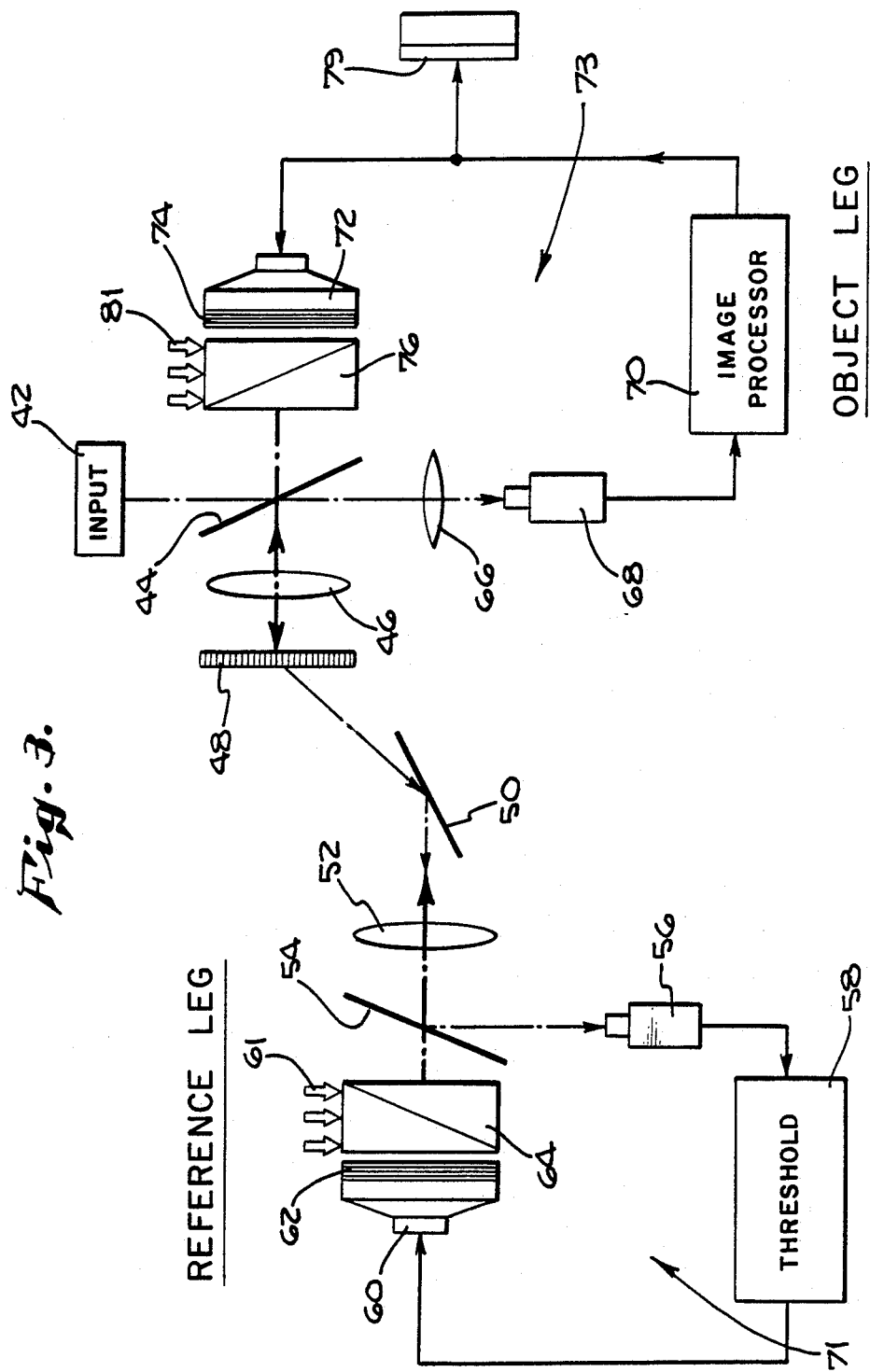
FIG. 3 shows a hybrid electronic and optical resonator associative memory system in accordance with a preferred embodiment of this invention.

FIG. 3 shows a hybrid optical and electronic associative memory system in a resonator configuration. A distorted image is input at the input plane 42 to a beam splitter 44. A portion of the image from the input plane 42 is imaged onto vidicon 68 by imaging lens 66. This image is imparted electronically onto CRT 72 via an optional image processor 70. The light from the face of CRT 72 activates LCLV 74 which in turn modulates the birefringent phase of readout beam 81. Polarizing beam splitter 76 converts this birefringent phase modulation into amplitude modulation. The readout beam is then directed through the Fourier transform lens 46 onto the hologram 48, where the correlation of the input image is processed by a first iteration loop 71. A beam splitter 54 provides a liquid crystal light valve 62 and the correlation plane of a vidicon 56 with a convolved and correlated image for further processing to eliminate losses and to provide thresholding. The vidicon 56 provides a distorted correlation plane image to the threshold electronics 58, which may be an image-processing circuitry system, known in the art, which, for example, grabs frames once every thirtieth of a second and freezes the information, making it available for further processing. Slower rates may also be used.

As indicated in the discussion of FIGS. 1 and 2, the threshold device 58 selects a portion of the correlation image presented to the vidicon 56 for further processing. Threshold 58 passes those incoming signals of sufficient intensity only, using the light intensity provided at the center of the correlation image on the plane of the vidicon 56 as a standard. The threshold provides this enhanced imaging to the CRT screen 60.

The CRT screen 60 acts to phase-modulate a projection light 61 which is then amplitude-modulated at the polarizing beam splitter 64. The output of the polarizing beam splitter 64 is presented back to the beam splitter 54 and the correlation lens 52, and passed by the mirror 50 back to the hologram 48. In the embodiment shown in FIG. 3, a resonator effect occurs because rather than reading out an image at the vidicon 68, the enhanced output image is now impressed upon the second iteration loop 73. The beam splitter 44 provides this enhanced image to an imaging lens 66 for input to the vidicon 68. The image on the vidicon 68 is again processed by a second image processor 70, which provides a further optional threshold to the signal where a further enhanced image appears on the screen of the CRT 72. The image on the screen of the CRT 72 then phase-modulates the readout beam 81 which is projected along the LCLV 74 through a polarizing beam splitter 76 and back to the Fourier transform lens 46 and the hologram 48. The enhanced signal continues to loop back and forth between the first iteration loop 71 and the second iteration loop 73 until the stable states of the overall system of the object and reference pairs stored in the hologram 48 are achieved. This nonlinear system will jump from object state to reference state depending on the overlap of the input image with the stored objects. The less distorted the input image provided originally by the input plane 42, the more quickly will resonance occur and the system arrive at a stable state. A latching of the system will provide (at the output plane 79) an image which can be used to identify stored objects and display their real time position and velocity in both object and reference spaces.

A distinct advantage of the system hereinbefore disclosed is that the image processor of thresholding devices 24, 58, and 70, may all operate at rates of 30 frames per second or greater, and they do not require the interferometric stability needed when an all-optical system is used to match a stored hologram image with an input object. Since the correlation image provided to the vidicon 22 is fully swept and stored by the electronic threshold, for example, 24 in 1/30 of a second, movement of the object at the input plane 12 slower than 1/30 of a second will not affect the resolution of the enhanced reference beam provided to the hologram 18 (FIG. 1).

It is understood that additional embodiments beyond those shown in the description of the preferred embodiment may be envisioned which reflect the spirit and function of the disclosed embodiments. Yet, it is desired that protection under the appended claims extends to equivalent designs. For example, the associative memory system of this invention may be thought of as one which is capable of associating a first body of data recorded within a memory storage means with a second incomplete body of data where there is need to use a reference set of data to perform an associate function. Such a data processing system could require that the reference set of data and a composite product set of data be enhanced. In such a system the reference set of data would be enhanced by an electronic data processing means capable of resolving, thresholding, and amplifying the reference set of data. One such device that may be useful for enhancing data (in the form of a matrix) is a circuit operating much as the image processor or threshold device 24 of this invention. That is, variations of intensity or value of the correlated data may be computed for enhancing and averaging by the threshold device 24 so that a correlated image with better resolution may be provided for the associative processing function. Such a system may perform associative conjugating functions through the use of acoustical holograms or related systems. Also, as discussed heretofore, an electronically activated spatial light modulator (SLM) which allows an electronic signal to directly modulate the readout beam on the projection side of the SLM could be used in place of the LCLV disclosed. In such a system, the CRT screen element would not be needed to enhance the partially distorted hologram image.

Thus, not every element used in the preferred embodiment would be required to achieve controlled thresholding. Such an interchangeable choice of components is contemplated when determining the scope of the appended claims. Thus, the invention disclosed herein is not intended to be limited to an optically-oriented or the hybrid optical and electronic system disclosed herein.

What is claimed is:

1. A hybrid optical and electronic associative memory system capable of recalling a stored image when the memory system is provided with a distorted input image which is a partial or distorted version of the stored image, comprising:

a hologram including at least one stored image, said stored image comprising a first stored image of a first object, said first stored image being recorded with a first reference beam, said first stored image being a transform of a first real image of said first object;

image transforming means for providing a transform of the distorted input image to said hologram, so as to generate a distorted reference beam;

means for transforming said distorted reference beam into a correlation image related to said first stored image and distorted input image; and means for enhancing said correlation image, including:

an electro-optical thresholding means for thresholding said correlation image and eliminating low level spurious light therein while preserving shift-invariance, said electro-optical thresholding means including an electronic threshold processor for thresholding said correlation image, and optical means for amplifying and conjugating the thresholded correlation image to generate an amplified correlation image signal, wherein said optical means includes a spatial light modulator.

2. The hybrid optical and electronic associative memory system of claim 1, wherein the image transforming means comprises a Fourier transform lens.

3. The hybrid optical and electronic associative memory system of claim 1, wherein the hologram is a Fourier transform hologram.

4. The hybrid optical electronic associative memory system of claim 1, wherein the hologram is a Fresnel hologram.

5. The Hybrid optical electronic associative memory system of claim 1, wherein the hologram is a volume hologram.

6. The hybrid optical and electronic associative memory system of claim 1, wherein said optical amplification means comprises a CCD-LCLV.

7. A hybrid optical and electronic associative memory system capable of recalling a stored image when the memory system is provided with a distorted input image which is a partial or distorted version of the stored image, comprising:
a hologram including at least one stored image, said stored image including a first stored image of a first object, said first stored image being recorded with a first reference beam, said first stored image being a transform of a first real image of said first object;
image transforming means for providing a transform of the distorted input image to said hologram so as to generate a distorted reference beam;
means or transforming said distorted reference beam into a correlation image related to said first stored image and distorted input image; and
means for enhancing said correlation image, including an electro-optical thresholding means, for thresholding said correlation image and eliminating low level spurious light therein, wherein said electro-optical thresholding means includes:
(a) a first vidicon camera for receiving said correlation image and generating a vidicon signal;
(b) an electronic threshold processor for processing said vidicon signal to threshold and enhance the resolution of said vidicon signal and provide a thresholded output signal; and
(c) A CRT having a CRT output screen, the thresholded output signal being provided to said CRT so as to generate an electro-optical image signal at said CRT output screen;
optical amplification means for amplifying the threshold correlation image to generate an amplified correlation image signal, wherein said means for amplifying includes a spatial light modulator positioned in juxtaposed adjacent alignment with said CRT output screen, said spatial light modulator modulating a high intensity readout beam in response to the thresholded output signal, so as to generate the amplified correlation image signal.

8. The hybrid optical and electronic associative memory system of claim 7, wherein said spatial light modulator is a liquid crystal light valve (LCLV).

9. The hybrid optical and electronic associative memory system of claim 8, wherein said system acts as a resonator by further including:
(a) a second vidicon camera for receiving said output image from said hologram and generating a second vidicon signal;
(b) a second threshold pressure for processing said second vidicon signal and providing an object leg threshold signal;
(c) a second CRT, having an output screen, said second CRT for generating a CRT signal responsively to said object leg thresholded signal;
(d) a second LCLV, operatively linked to said second CRT, for modulating a second high intensity readout beam, and
(e) means for directing the modulated second high intensity readout beam to said hologram.

10. An associative memory system capable of associating a first body of data with a second incomplete body of data, comprising:
(a) data storage means for storing a first transformed set of data corresponding to said first body of data, and a reference set of data corresponding to a transform of a plurality of delta functions;
(b) data input means for providing said data storage means with a second transformed set of data corresponding to the second incomplete body of data so as to generate a composite product of the transform of said first body of data, the second transformed set of data and the reference set of data;
(c) means for enhancing the composite product including a first electronic data processing means for thresholding the composite product and generating a thresholded signal, and
a data amplifier operating in association with said electronic data processing means,
for receiving a readout beam and modulating said readout beam with the thresholded signal such that a modulated signal is generated;
(d) means for redirecting the modulated signal to said data storage means, and
(e) associative processing means, operatively linked to said data storage means, for retrieving said first body of data, by identifying an association between said first body of data and said second incomplete body of data, when said data storage means is provided with the modulated signal.

11. The system of claim 10 further comprising:
a data resonator which provides adjustable thresholding of said incomplete body of data, said resonator comprising:
a second electronic data processing means for thresholding, disposed on the side of said data storage means opposite from said first electronic data processing means, so that the modulated signal iteratively loops back and forth between the first and second electronic data processing means.

12. A hybrid optical and electronic associative memory system for recalling a first stored image when the memory system is provided with a distorted incomplete input image, comprising:
(a) a hologram having the first stored image of an object recorded therein as a scattered field pattern transform;
(b) means for providing the distorted incomplete input image to said hologram so as to generate a distorted reference beam;
(c) electro-optical means for resolving the reference beam so as to generate an enhanced reference beam, including:
a correlation lens;
image processor having an adjustable control for setting the threshold of the reference beam, and generating a thresholded reference beam;
means for modulating a readout beam responsively to the thresholded reference beam, so as to generate the enhanced reference beam, and
(d) an object leg of the system disposed on the side of said hologram opposite to said electro-optical means, to form a resonator with said electro-optical means, said object leg including:
a second means for modulating a second readout beam, and
a second thresholding means, the enhanced reference beam, from said electro-optical means iteratively looping through said hologram between said electro-optical means and said object leg, and reconstruction an output image corresponding to said first stored image.

13. The hybrid optical and electronic associative memory system of claim 12, wherein said first and second means for modulating are directly electronically controlled to modulate, respectively, said first and second readout beams.

* * * * *